(12) United States Patent
Xie et al.

(10) Patent No.: US 7,472,367 B1
(45) Date of Patent: Dec. 30, 2008

(54) METHOD OF OPTIMIZING INTERCONNECT DISTRIBUTION TO IMPROVE SIGNAL INTEGRITY

(75) Inventors: Yuanlin Xie, Fremont, CA (US); Hong Shi, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 282 days.

(21) Appl. No.: 11/262,347

(22) Filed: Oct. 27, 2005

(51) Int. Cl.
*G06F 17/50* (2006.01)

(52) U.S. Cl. .......................................... 716/13; 716/12
(58) Field of Classification Search ............... 716/12–16
See application file for complete search history.

(56) References Cited

U.S. PATENT DOCUMENTS 6,523,154 B2 * 2/2003 Cohn et al. ................. 716/6
6,789,241 B2 * 9/2004 Anderson et al. ............... 716/5
6,915,249 B1 * 7/2005 Sato et al. ...................... 703/14

* cited by examiner

*Primary Examiner*—Jack Chiang
*Assistant Examiner*—Binh C Tat
(74) *Attorney, Agent, or Firm*—Morgan, Lewis & Bockius LLP

(57) ABSTRACT

A method of distributing an array of interconnects on an electronic device divides the array into multiple regions, each region having certain performance requirements. For each region, predefined performance curves are used to choose from a plurality of interconnect distribution pattern modules one or more interconnect distribution pattern modules that satisfy the corresponding performance requirements. The chosen interconnect distribution pattern modules are used to generate a performance indication map highlighting those vulnerable interconnect(s) that may suffer severe crosstalk interference. Each vulnerable interconnect is then relocated to a different location until the performance requirements are met.

14 Claims, 24 Drawing Sheets

D=1.4
S:P:G=16:1:1

D=1.4
S:P:G=16:1:1

D=1.4
S:P:G=14:1:1

D=1.4
S:P:G=13:1:1

■ Ground Interconnect

▦ Power Supply Interconnect

☐ Signal Interconnect

METHOD OF OPTIMIZING INTERCONNECT DISTRIBUTION TO IMPROVE SIGNAL INTEGRITY

FIELD OF THE INVENTION

The present invention relates generally to the field of circuit layout, and in particular, to a method of optimizing the distribution of interconnects on an integrated circuit or a package substrate of an electronic device to improve its signal integrity.

BACKGROUND

Conventional interface designs, including determining the interconnect count and distribution for an electronic device, have long been an empirical, rule-of-thumb process. When the device's processing speed was relatively slow, this conventional process did not cause a significant concern about the device's signal integrity because the device usually had sufficient margins in terms of sampling window and logic threshold. However, as increases in processing speed reduce these margins, these conventional interface design processes create more and more signal integrity challenges for an electronic device designer. In view of the above, it is highly desirable to develop a systematic approach to optimize the interconnect distribution on an electronic device.

SUMMARY OF EMBODIMENTS

In a preferred embodiment of the present invention, an array of interconnects on an electronic device is divided into multiple regions, each region having certain performance requirements. Illustratively, these performance requirements include a signal integrity requirement, an interconnect count requirement and/or a package size requirement. The signal integrity requirement may be expressed as limits on different types of noises including crosstalk, accumulated mutual inductance, ground bounce, power supply sagging, and/or other criteria known in the art. For each region to satisfy its performance requirements, one or more interconnect distribution pattern modules are chosen from a plurality of interconnect distribution pattern modules based on predefined performance curves that relate some or all of the performance requirements to one or more parameters of the distribution patterns. In a preferred embodiment, the chosen interconnect distribution pattern modules are used to generate a performance indication map highlighting those vulnerable interconnect(s) that may suffer severe noise interference. Each vulnerable interconnect is then relocated to a different location until the device's performance requirements are met.

Advantageously, the invention is implemented in software and performed on a computer.

BRIEF DESCRIPTION OF THE DRAWINGS

The aforementioned aspects of the invention as well as additional aspects will be more clearly understood as a result of the following detailed description of the various embodiments of the invention when taken in conjunction with the drawings.

Like reference numerals refer to corresponding parts throughout the several views of the drawings.

DETAILED DESCRIPTION OF EMBODIMENTS

As mentioned earlier, the present invention is directed to a systematic approach to optimizing the interconnect distribution on an electronic device to satisfy the device's signal integrity requirements. An electronic device typically includes a semiconductor integrated circuit (IC) and an electronic package. The electronic package has a package substrate and the package substrate includes an array of solder balls on one surface. The solder balls are electrically coupled to an array of solder bumps on the surface of the circuit through an interconnection circuitry in the package substrate. For illustrative purpose, the following discussion focuses on how to optimize the distribution of an array of interconnects on a Ball Grid Array (BGA) package substrate to reduce noise/crosstalk between different interconnects. However, it will be apparent to one skilled in the art that the present invention is equally applicable to other types of packages, such as a Pin Grid Array (PGA) or a Land Grid Array (LGA) package. The methodology discussed here can also be implemented in the design of an array of solder bumps on the surface of the circuit or an array of 2D connectors embedded in a printed circuit board (PCB).

Figure 1:
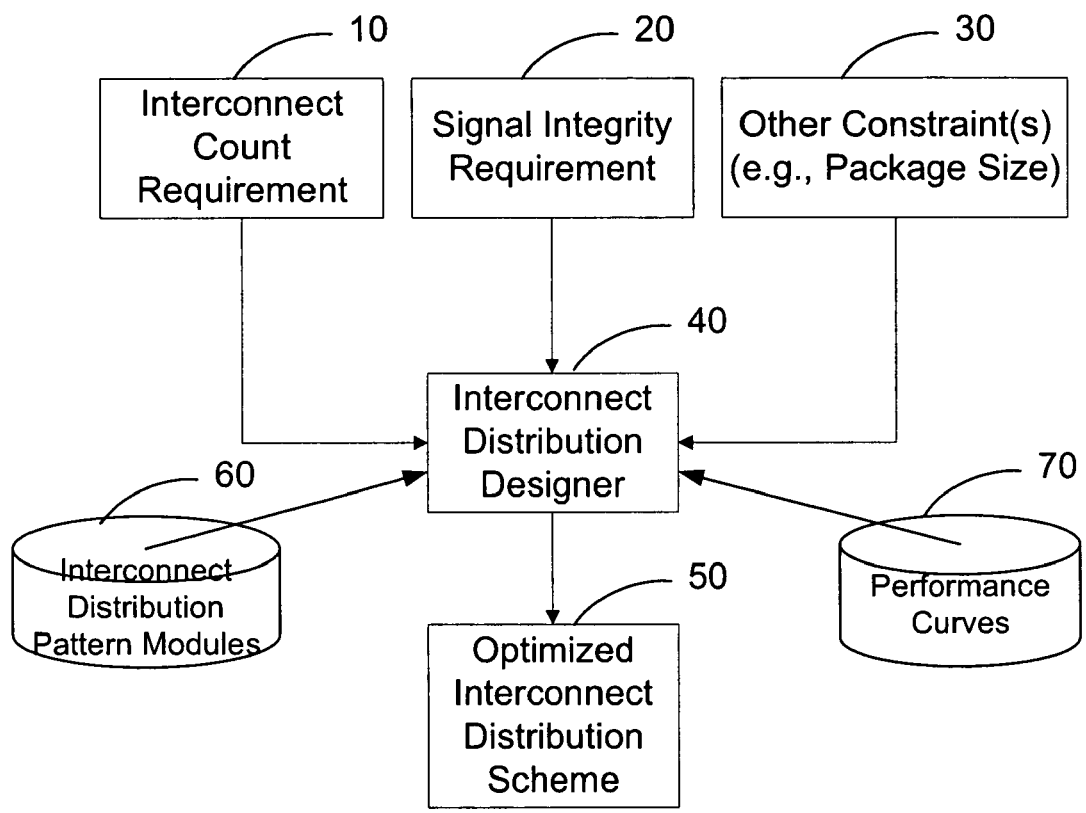
FIG. 1 is an overview flowchart illustrating a method of optimizing the interconnect distribution on a package substrate according to some embodiments of the present invention.

FIG. 1 is an overview flowchart illustrating such a method of optimizing the interconnect distribution on a package substrate according to some embodiments of the present invention. Typically, there are multiple performance requirements affecting the interconnect distribution (including the interconnect count) on a package substrate. For example, an engineer responsible for a circuit designed to be coupled to the package substrate may provide an interconnect count requirement 10. This requirement usually depends on the functionalities implemented in the circuit. A circuit typically requires a plurality of I/O or signal interconnects and one or more reference interconnects including power supply and ground interconnects. The signal interconnects provide the communication channels between this circuit and other circuits in the same electronic system. For every signal line, there is an associated return current path. The reference interconnects such as the power supply and ground interconnects are often used as the return current paths.

A procedure, such as a system-level simulation, is often performed to make sure that an electronic system operates as designed. An important output from the system-level simulation is the signal integrity requirement 20 associated with each individual circuit of the electronic system. The signal integrity requirement typically is expressed as limits on different types of noises including crosstalk, accumulated mutual inductance, ground bounce, power supply sagging and/or other criteria known in the art. Generally, different circuits within a system play different roles. Some of the roles may be more crucial than others to sustain a stable system operation and therefore have a more critical signal integrity requirement. Different levels of signal integrity requirement will have an impact on the package design, in particular the distribution of interconnects on the package substrate.

In addition to the interconnect count requirement 10 and the signal integrity requirement 20, there might be other constraints 30 affecting the package design. For example, the size of an electronic system, which is getting smaller and smaller in most cases, imposes a limit on the size of each individual electronic package in the system, such as the design rule of the interconnection circuitry's line and spacing, the pitch between two solder balls/solder bumps, etc. In some embodiments, this size limit may put a further limit on the interconnect count and signal integrity requirements derived from other sources as mentioned above. Therefore, a package designer has to take a holistic view of all constraints in order to design an optimized interconnect distribution on a package substrate.

Figure 3A:
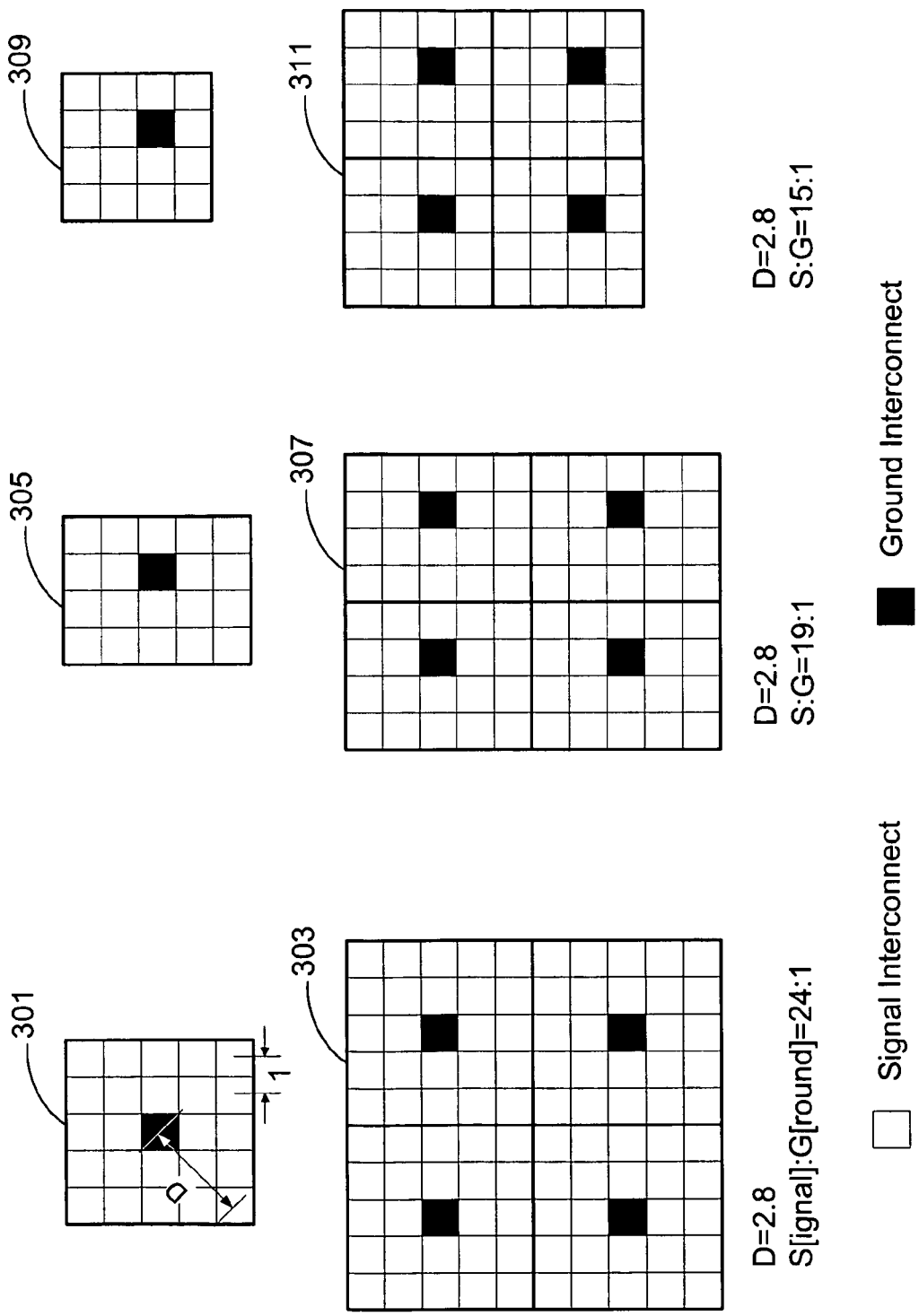
FIGS. 3A-3P are block diagrams illustrating multiple interconnect distribution pattern modules according to some embodiments of the present invention.
Figure 3P:
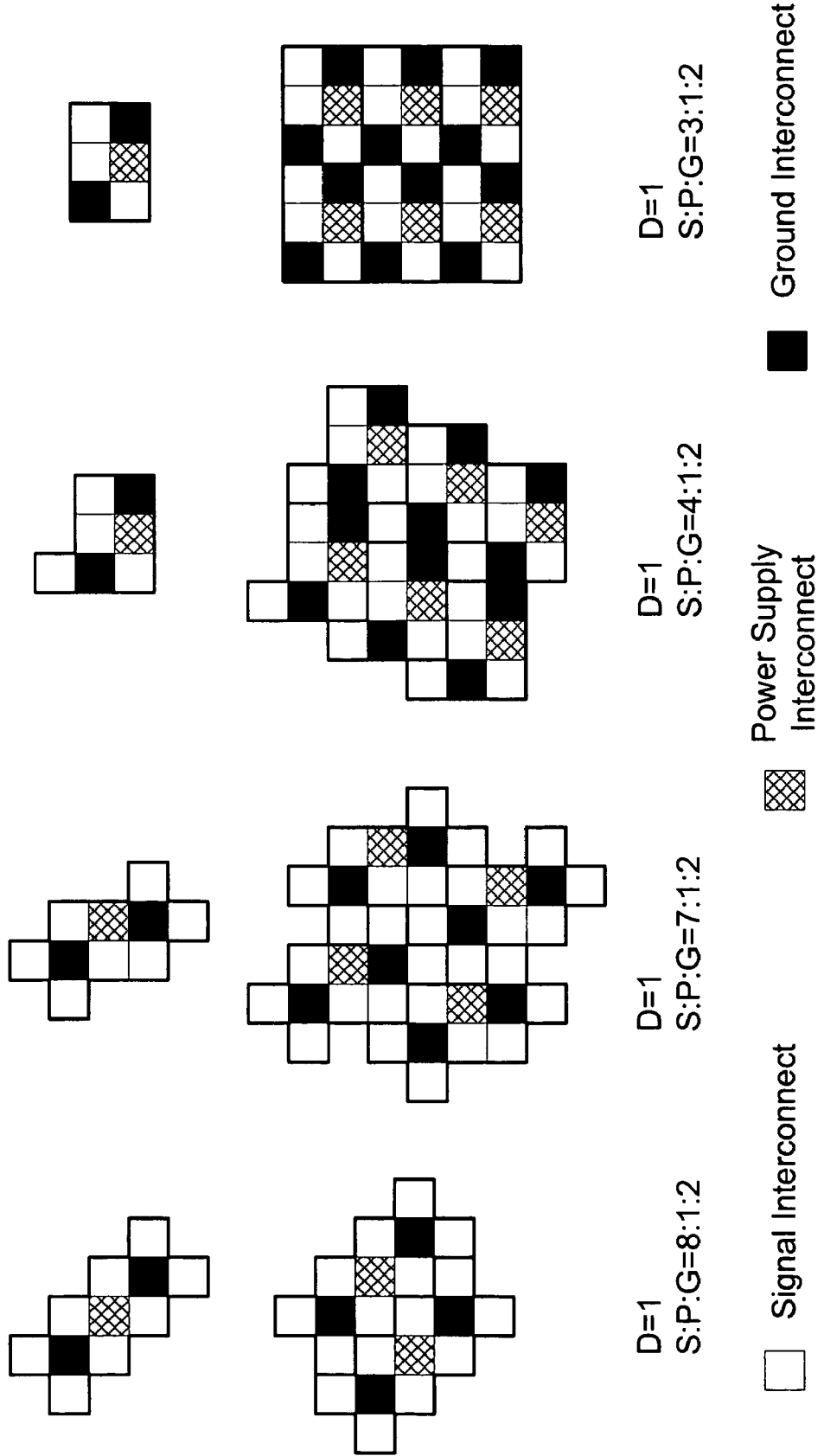
Figure 4A:
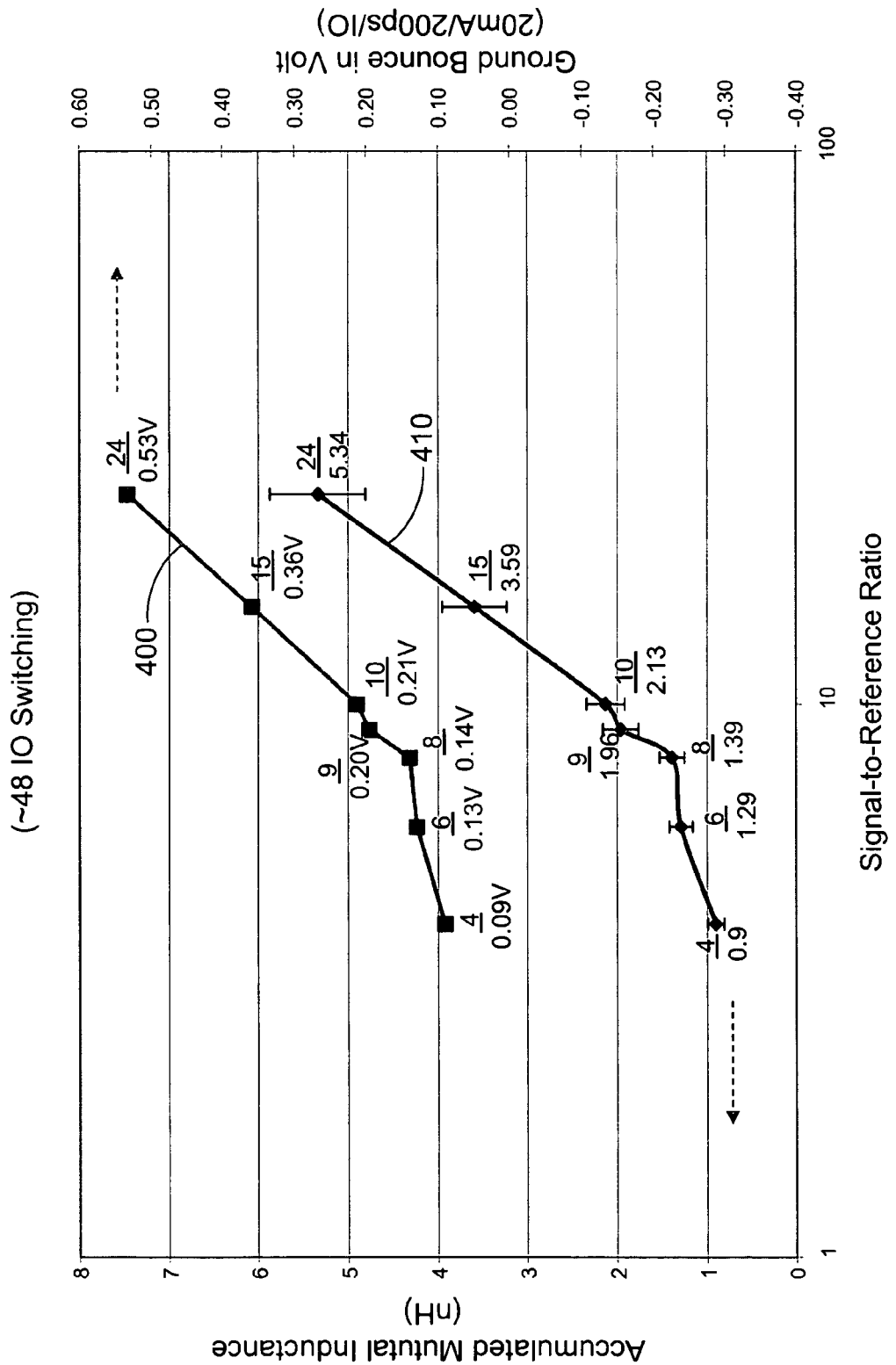
FIGS. 4A and 4B are diagrams depicting illustrative performance curves according to some embodiments of the present invention.
Figure 4B:
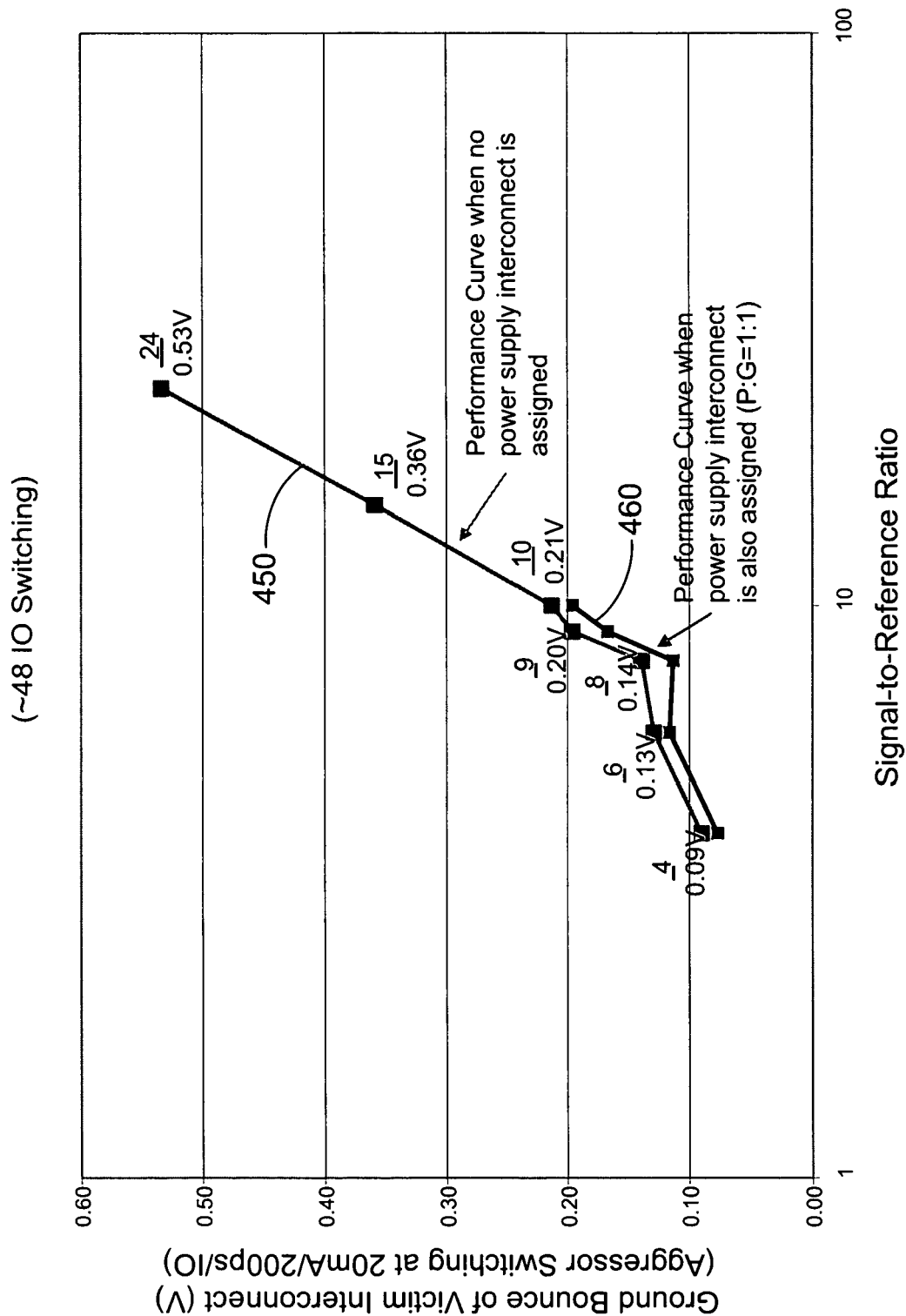

At the core of the overview flowchart shown in FIG. 1 is an interconnect distribution designer 40. The interconnect distribution designer 40 uses as input the interconnect count requirement 10, the signal integrity requirement 20 and other constraints 30. Interconnect designer 40 also includes databases 60 and 70 of interconnect distribution pattern modules some of which are depicted in FIGS. 3A-3P and performance curves, two of which are depicted in FIGS. 4A and 4B. The performance curves relate some or all of the performance requirements to one or more parameters of the interconnect distribution pattern module on the basis of empirical studies and/or numerical simulations. Interconnect designer 40 outputs an optimized interconnect distribution scheme 50 for the package substrate. As discussed below in connection with FIGS. 5A and 5B, the interconnect distribution designer 40 may use one or more iterative processes to balance the often competing interests associated with different requirements. Ideally, each signal interconnect on the package substrate should be insulated by surrounding reference interconnects on all sides in order to achieve a high signal integrity. But the limited package size might make it impossible to have the number of reference interconnects specified by the signal integrity requirement. Therefore, the interconnect distribution designer 40 may have to make a compromise among various requirements to produce an optimized outcome.

Figure 2:
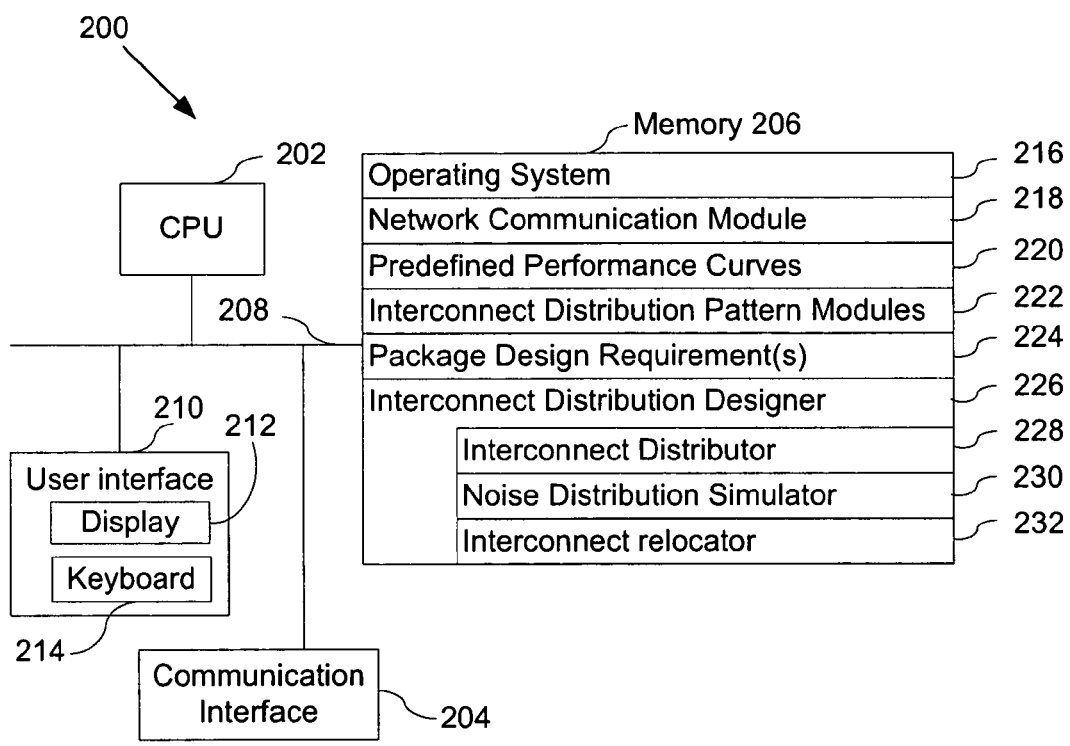
FIG. 2 is a block diagram of an illustrative interconnect distribution system according to some embodiments of the present invention.

FIG. 2 is a block diagram illustrating an exemplary interconnect distribution system 200 according to some embodiments of the present invention. The system 200 typically includes one or more processing units (CPUs) 202 or any other ICs, one or more network or other communications interfaces 204, memory 206, and one or more communication buses 208 for interconnecting these components. The system 200 optionally may include a user interface 210 comprising a display device 212 and a keyboard 214. Memory 206 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. Memory 206 may optionally include one or more storage devices remotely located from the CPU(s) 202. In some embodiments, memory 206 stores the following programs, modules and data structures, or a subset thereof:

- an operating system 216 that includes procedures for handling various basic system services and for performing hardware dependent tasks;
- a network communication module 218 that is used for connecting the system 200 to other computers via the one or more communication network interfaces 204 and one or more communication networks, such as the Internet, other wide area networks, local area networks, metropolitan area networks, and so on;
- predefined performance curves 220 pre-generated through experiments or numeric simulations;
- predefined interconnect distribution pattern modules 222;
- specific package design requirements 224; and
- an interconnect distribution designer 226 that may include an interconnect distributor 228, a noise distribution simulator 230 and an interconnect relocator 232.

More information about the interconnect distribution designer 226 and its associated modules including the interconnect distributor 228, the noise distribution simulator 230 and the interconnect relocator 232 is provided below in connection with FIGS. 5A and 5B.

FIGS. 3A-3P are block diagrams illustrating multiple predefined interconnect distribution pattern modules 222 corresponding to different signal-to-reference ratios and different distance values D according to some embodiments of the present invention. The signal-to-reference ratio is the ratio of the number of signal interconnects in an interconnect distribution pattern module to the number of ground and power supply interconnects. The distance parameter D is the maximum center-to-center distance between a signal interconnect and a ground or power supply interconnect nearest to the signal interconnect within an interconnect distribution pattern. By way of example, FIG. 3A depicts three interconnect distribution pattern modules 301, 305 and 309. Interconnect distribution pattern module 301 consists of 24 signal interconnects surrounding one ground interconnect. Four interconnect distribution pattern modules 301 placed side by side cover a larger region 303. The interconnection circuitry is deployed in the package substrate according to the arrangement of interconnect distribution pattern modules. Although the three interconnect distribution pattern modules have different signal-to-ground ratios, they share the same D value 2.8. Generally speaking, of the three modules shown in FIG. 3A, module 309 tends to yield the best result because it has the lowest signal-to-ground ratio when compared with the other two modules 301, 305. In some embodiments, one region may be filled with more than one type of interconnect distribution pattern module in order to satisfy the performance requirements. For example, if modules 301 and 309 are used to fill two adjacent regions on a package substrate, module 305 can be used to fill the boundaries between the two adjacent regions to have a smooth transition from one module to another one.

Figure 3B:
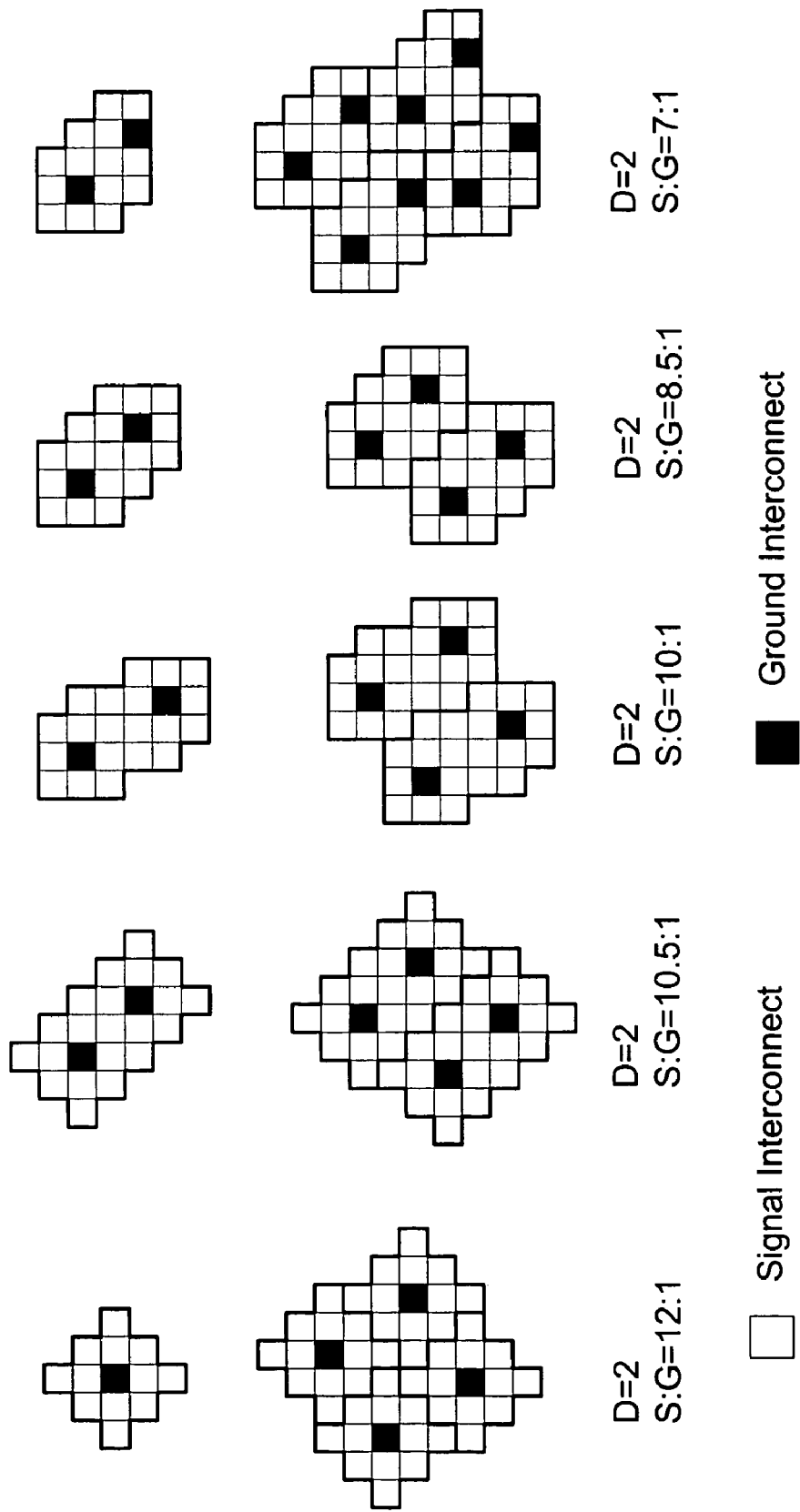
Figure 3C:
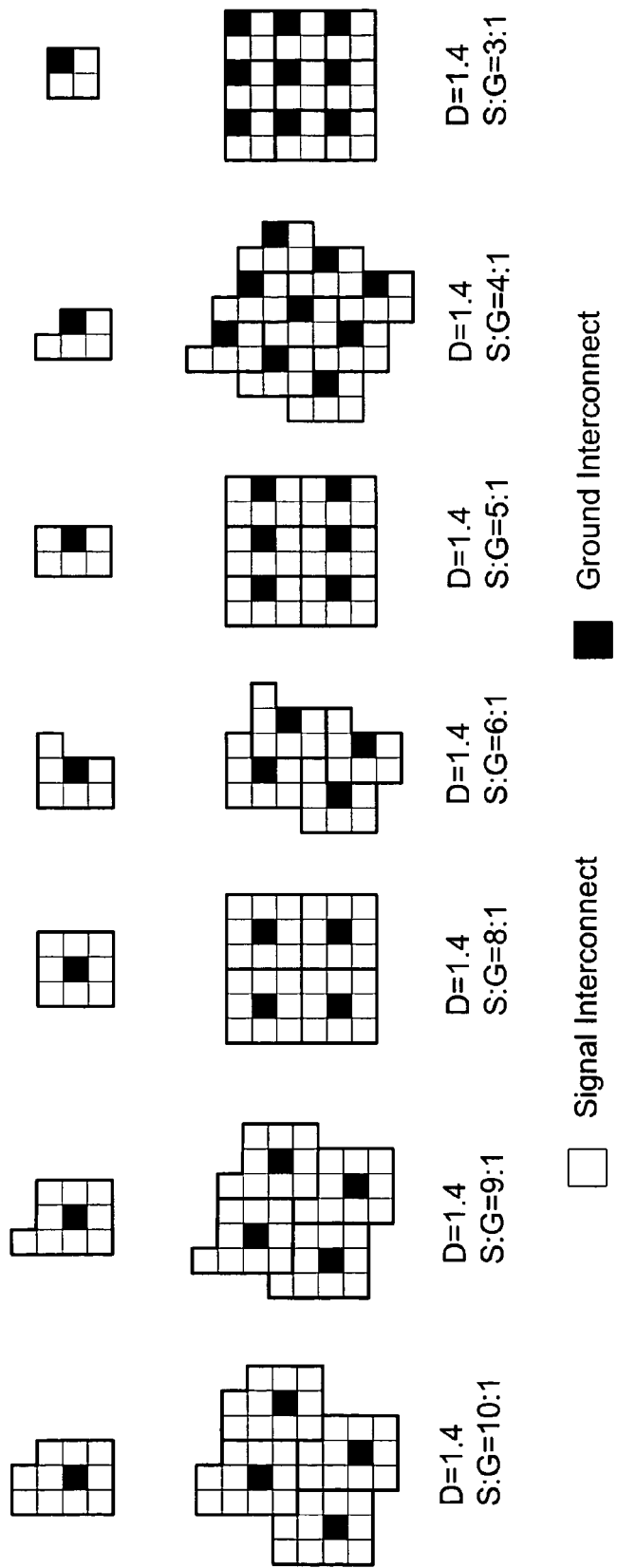
Figure 3D:
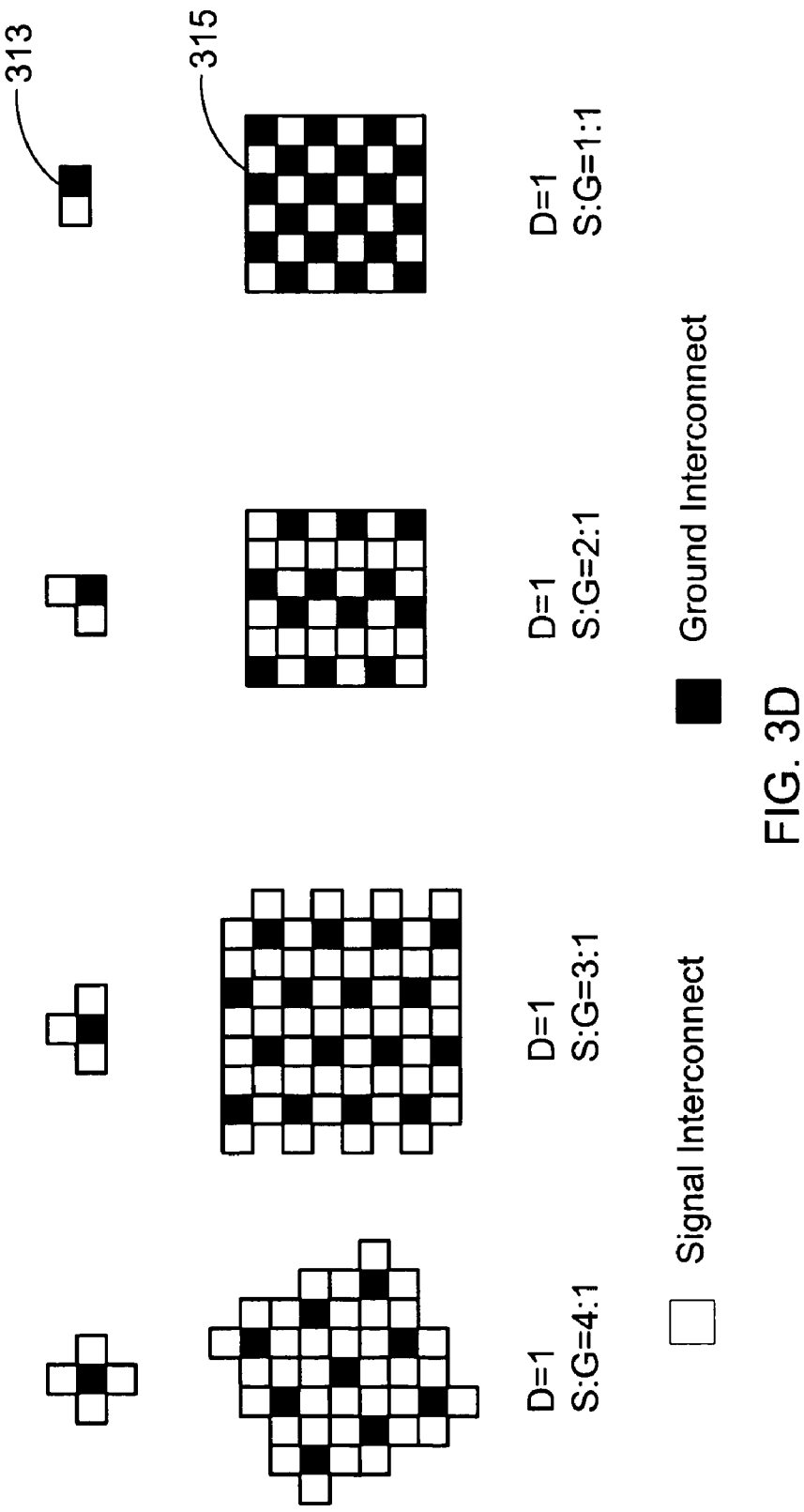
Figure 3E:
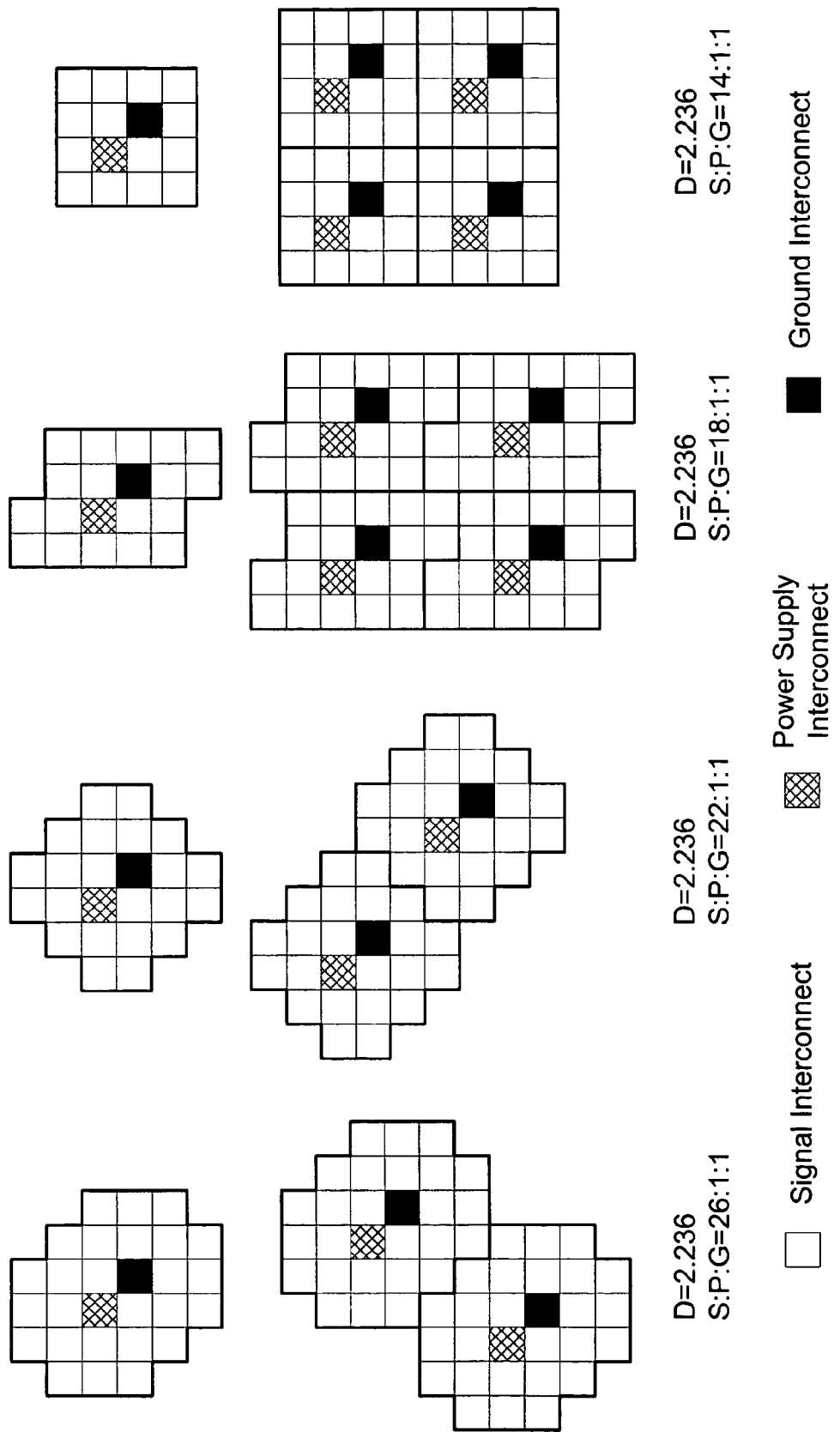
Figure 3F:
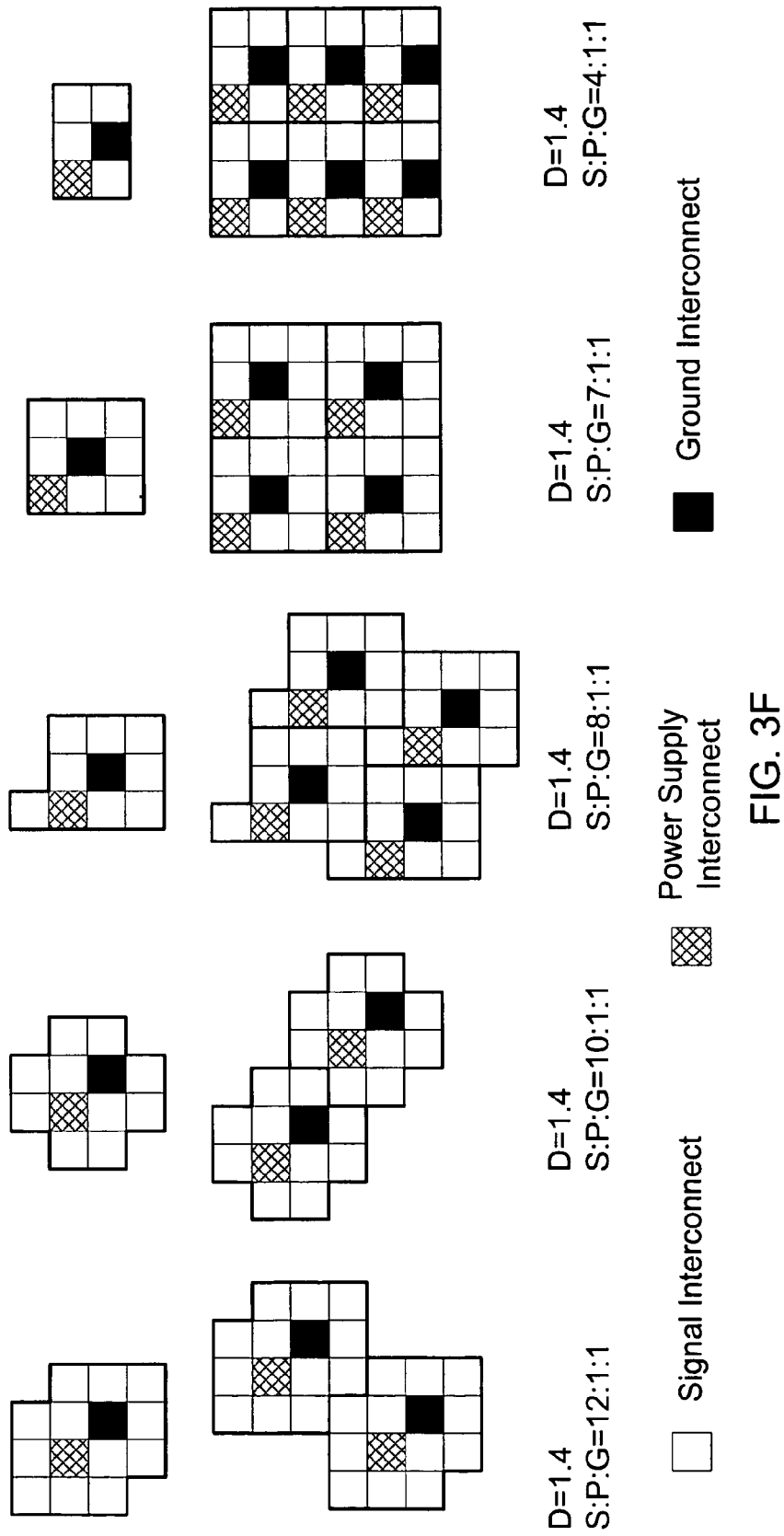
Figure 3G:
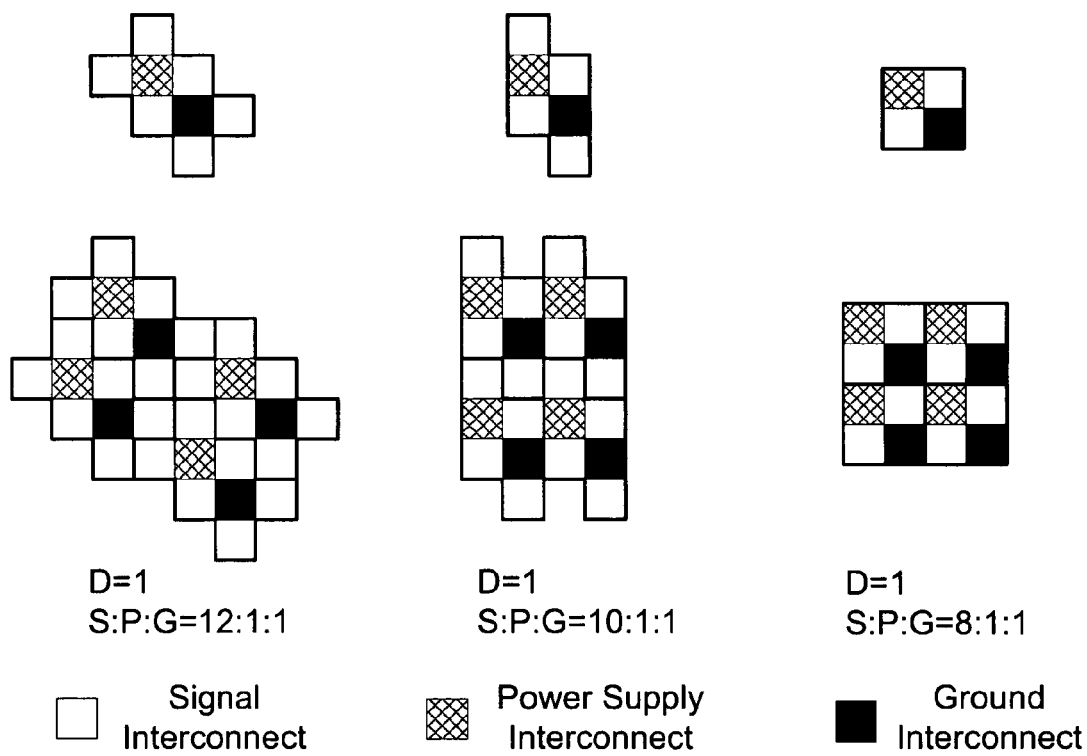
Figure 3H:
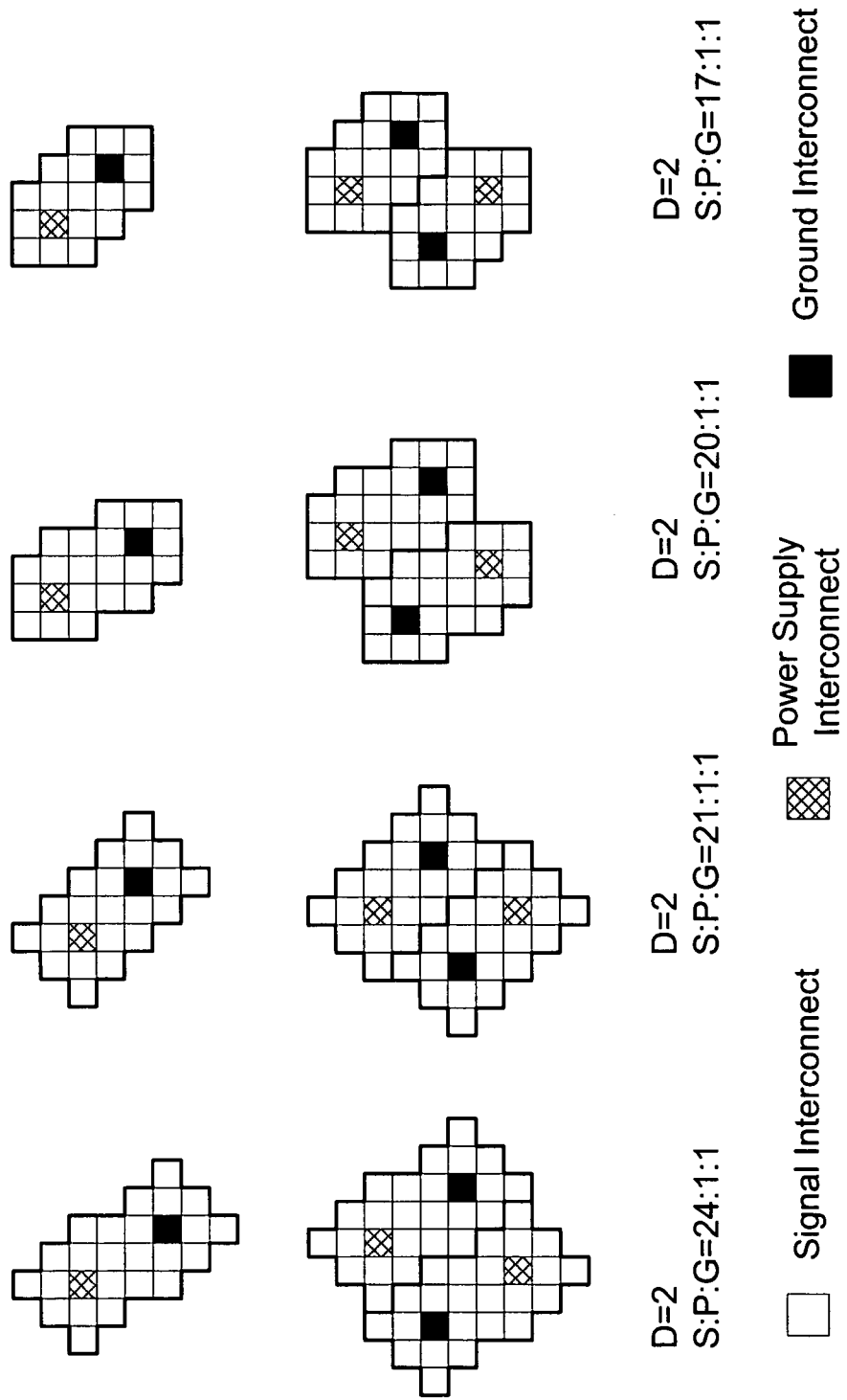
Figure 3I:
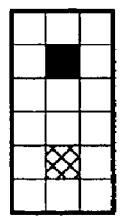
Figure 3I:
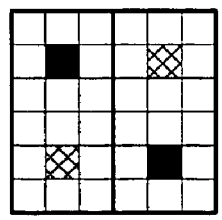
Figure 3I:
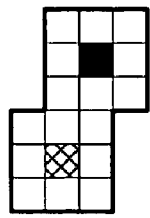
Figure 3I:
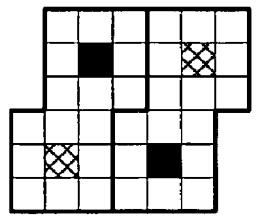
Figure 3I:
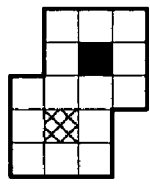
Figure 3I:
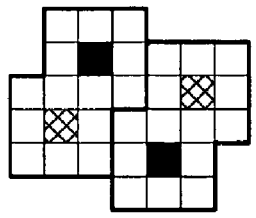
Figure 3I:
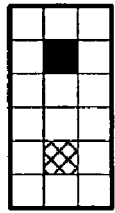
Figure 3I:
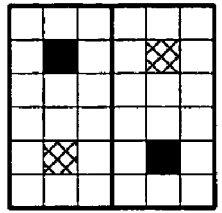
Figure 3J:
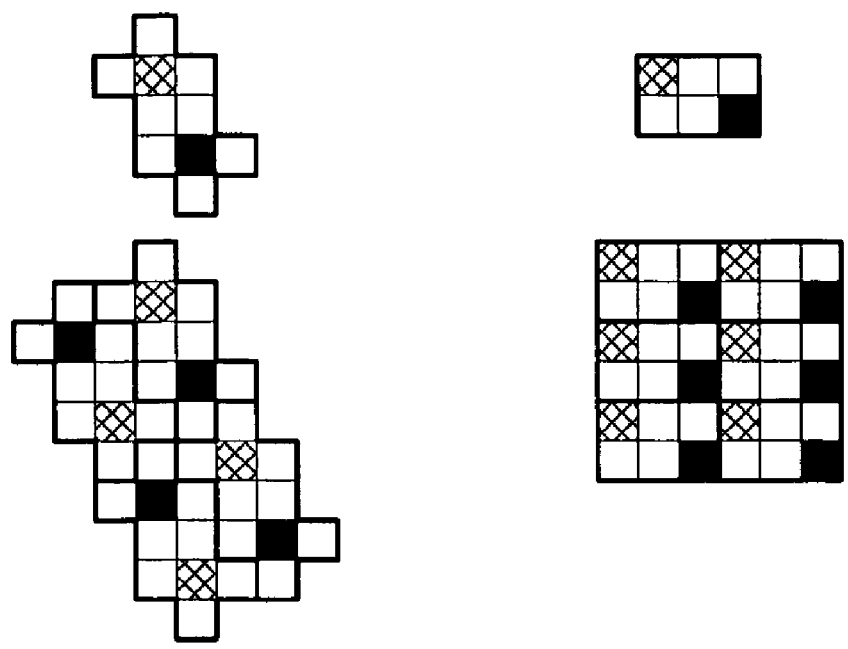
Figure 3K:
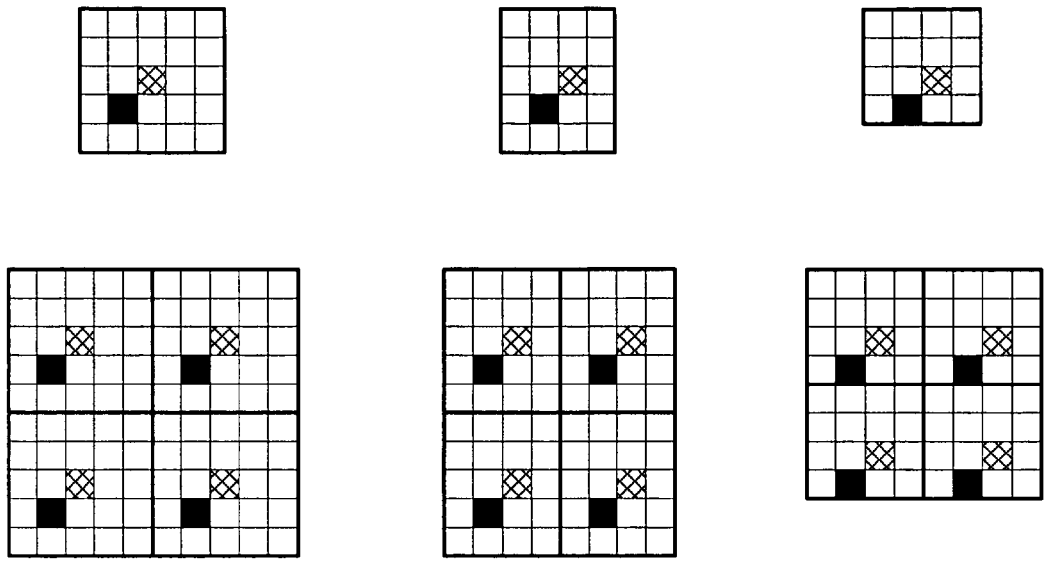
Figure 3L:
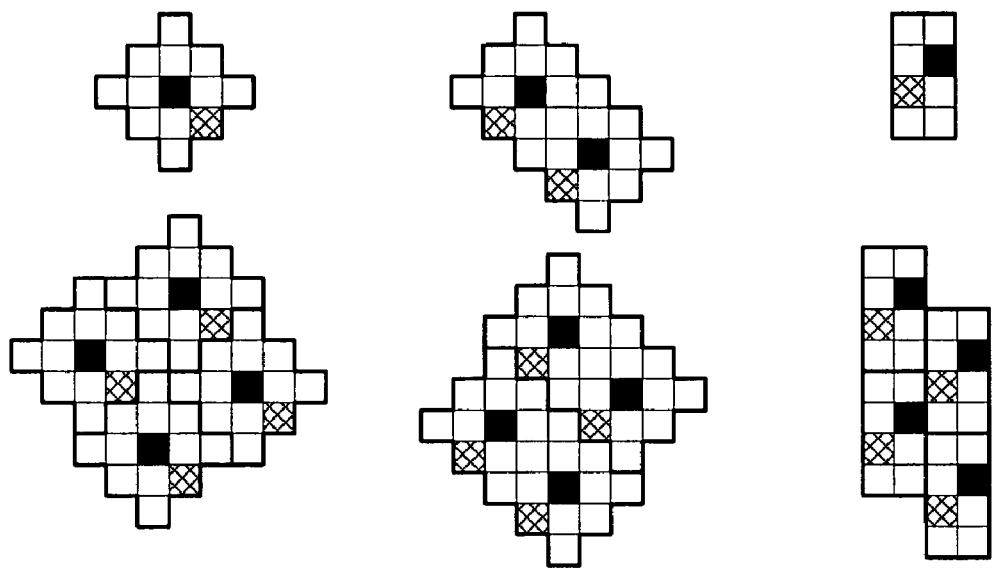
Figure 3M:
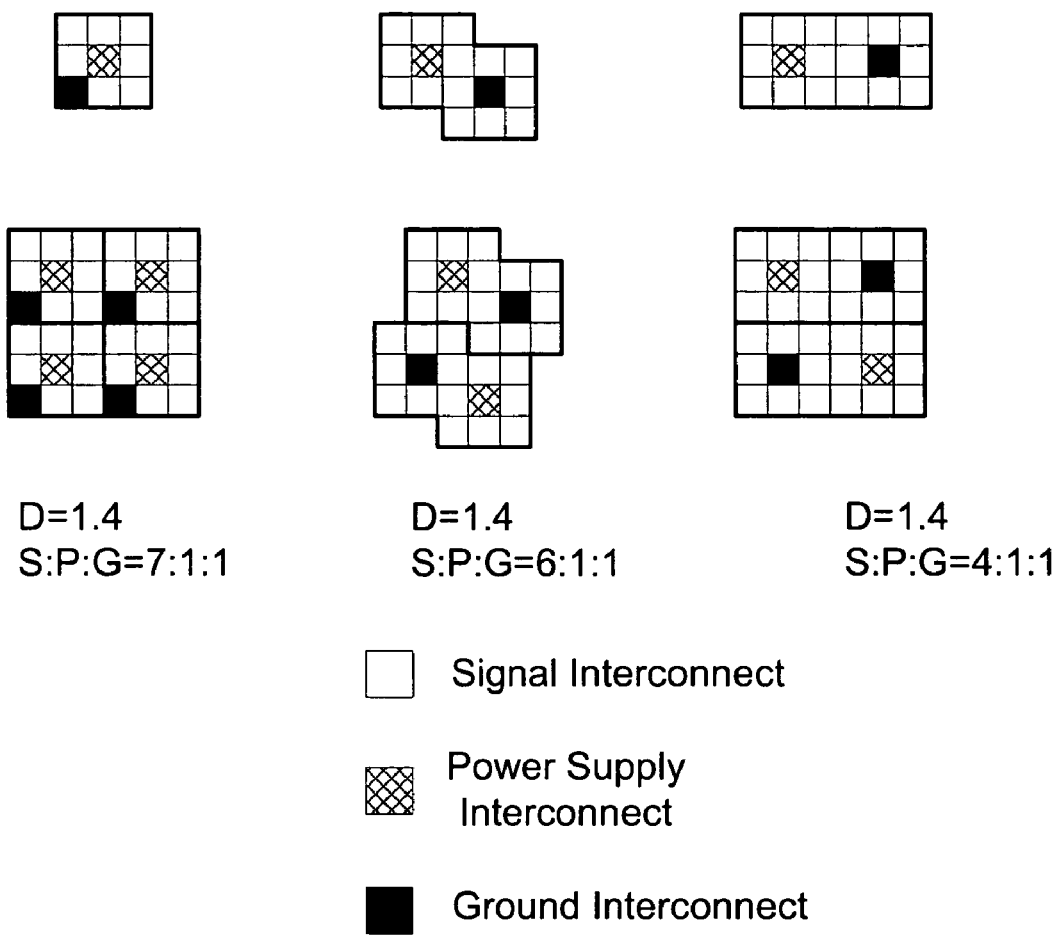
Figure 3N:
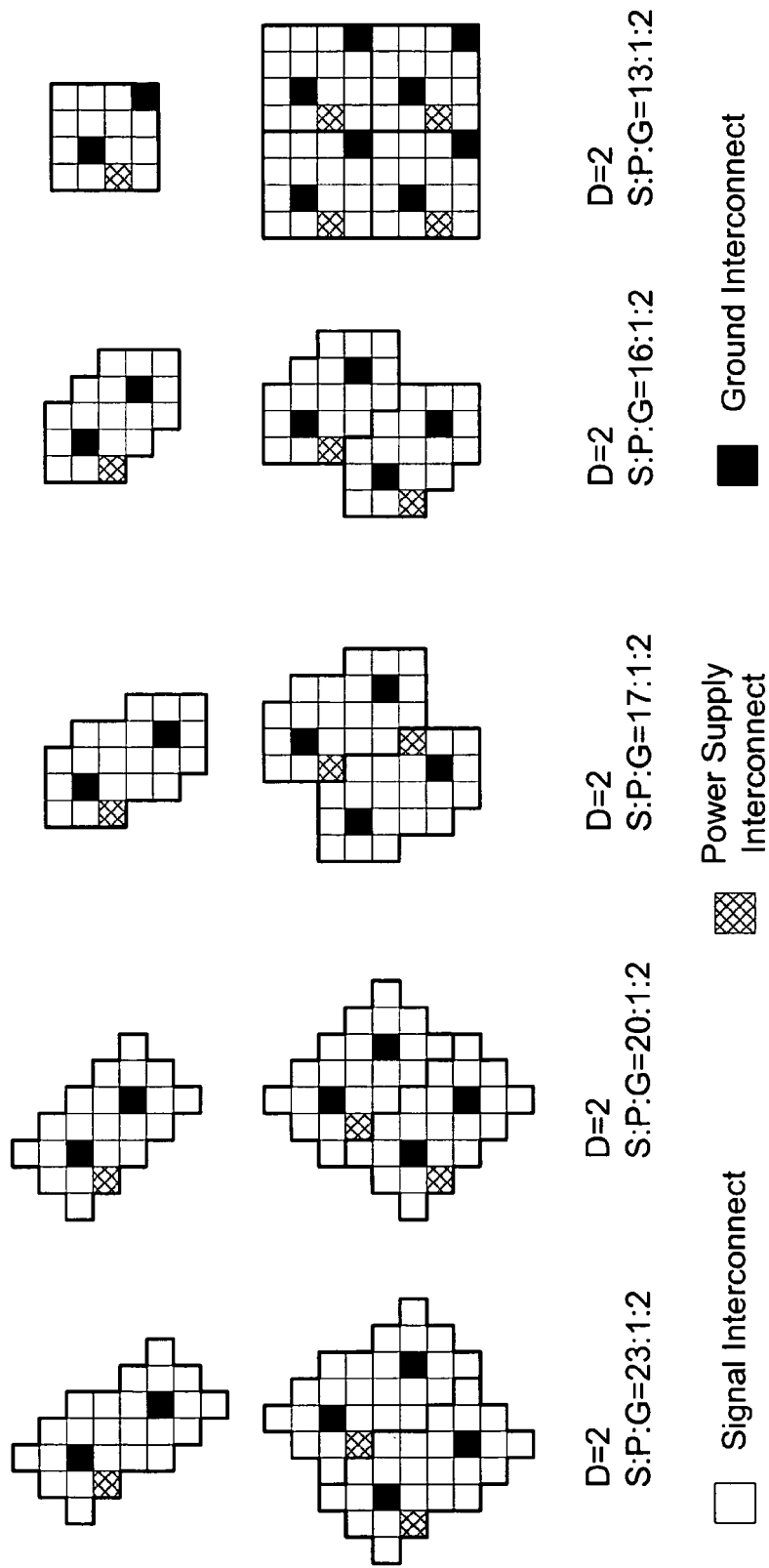
Figure 3O:
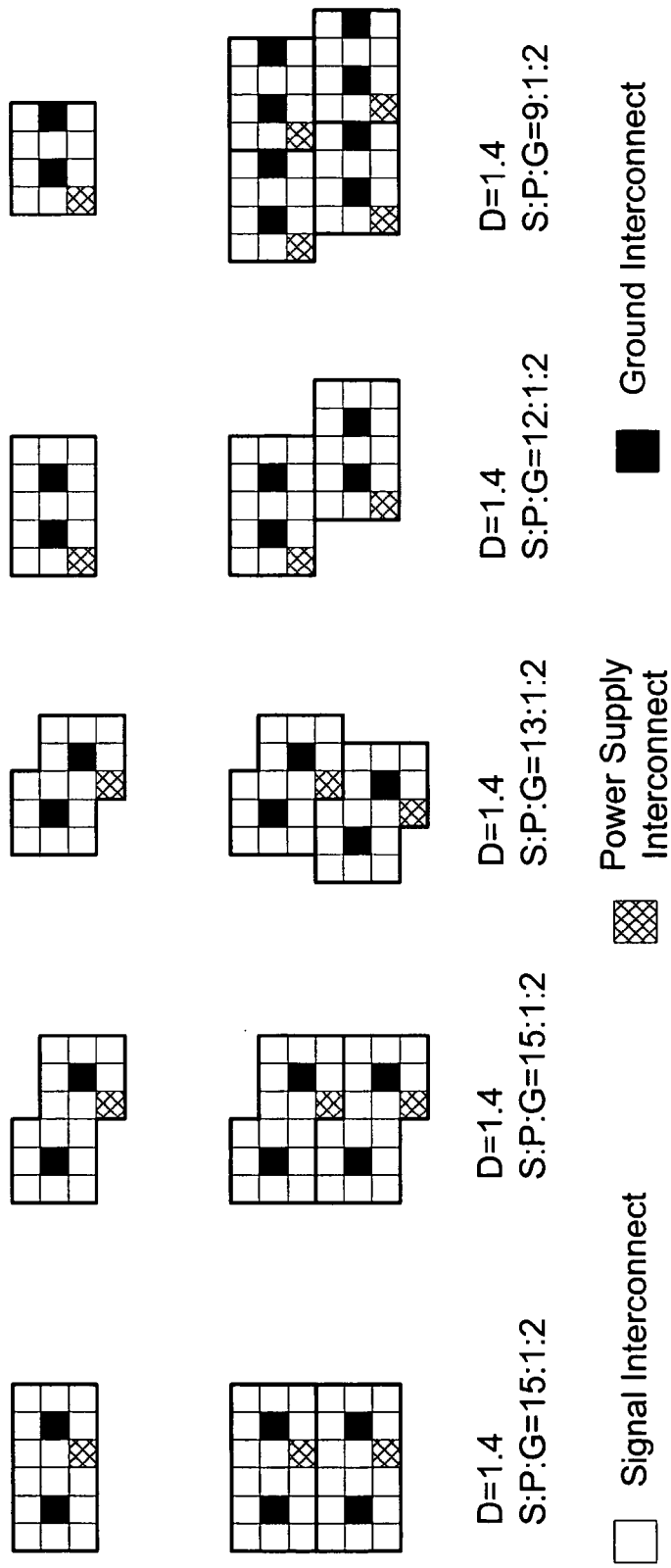

FIG. 3B depicts five interconnect distribution pattern modules wherein the maximum distance D is 2 and the signal-to-ground ratio varies from 12:1 to 7:1. As the signal-to-ground ratio decreases, a signal interconnect is surrounded by more and more ground interconnects in its neighborhood area. As a result, this signal interconnect is better insulated from various types of crosstalk interference. One skilled in the art will appreciate that other interconnect distribution pattern modules shown in FIGS. 3C-3P can be interpreted in a similar manner. For instance, FIG. 3D shows that when the signal-to-ground ratio drops to 1:1 (block 313), every signal interconnect in block 315 has four ground interconnects as immediate neighbors. FIG. 3E illustrates that every interconnect distribution pattern module includes a pair of a ground interconnect and a power supply interconnect approximately located at the center of the distribution pattern. This configuration has a significant advantage over the configurations of uniformly-distributed power or ground interconnects in terms of suppressing crosstalk noises. In FIG. 3N, every interconnect distribution pattern module includes two ground interconnects separated from each other by one or more signal interconnects and a power supply interconnect next to one of them. In this configuration, there is little increase of crosstalk noises when the number of signal interconnects doubles within each module. Note that the interconnect distribution pattern modules shown in FIGS. 3A-3P are only for illustrative purposes and are by no means exhaustive. One skilled in the art may find it quite straightforward (and sometimes necessary) to come up with other types of interconnect distribution pattern modules configurations for a given electronic package substrate.

FIGS. 4A and 4B are two diagrams of illustrative performance curves 220 according to some embodiments of the present invention. The horizontal coordinates of both diagrams correspond to the signal-to-reference ratio. The two vertical coordinates of the diagram in FIG. 4A correspond respectively to accumulated mutual inductance and ground bounce, two important types of crosstalk characterizing the performance of the circuit being packaged. More specifically, accumulated mutual inductance refers to the mutual inductance of a group of aggressor interconnects on a victim interconnect and ground bounce refers to the inductively induced voltage fluctuation in the internal ground lines of a circuit. Note that the labels "aggressor" or "victim" attached to an interconnect are for the convenience of performance monitoring. There may be signals passing through both aggressor interconnects and victim interconnects. The interconnect that is chosen for measuring the accumulated mutual inductance is referred to as the "victim" interconnect and the other interconnects are referred to as the "aggressor" interconnects relative to the "victim" interconnect. The curve 400 in FIG. 4A indicates that the ground bounce increases when the signal-to-reference ratio increases; and the curve 410 indicates that the accumulated mutual inductance increases when the signal-to-reference ratio increases. As is apparent from FIG. 4A, the rate of increase in both curves is much greater for signal-to-reference ratios greater than about 8 than for ratios less than 8.

FIG. 4B depicts how the ground bounce varies as a function of the signal-to-reference ratio depending upon whether the reference interconnect is an individual ground interconnect (curve 450) or a pair of a power supply interconnect and a ground interconnect located side by side (curve 460). The fact that the ground bounce in the latter case is only slightly lower than that in the former case for a given signal-to-reference ratio indicates that a pair of a power supply interconnect and a ground interconnect does not yield a significant drop of ground bounce. This may suggest that the ground interconnect and the power supply interconnect are not equal when used as a voltage reference plane and the ground interconnect is more effective than the power supply interconnect in suppressing noise like ground bounce.

Each performance curve is pre-generated through experiments or numeric simulation of typical interconnect distribution pattern modules and stored in database 70. For example, the curves shown in FIG. 4B are empirically generated by measuring the ground bounce at a specific victim interconnect when there are 48 aggressor interconnects switching simultaneously, each at the rate of 20 mA/200 ps. In practice, the interconnect distribution designer may need to have access to a large number of performance curves for use in the design effort.

Figure 5A:
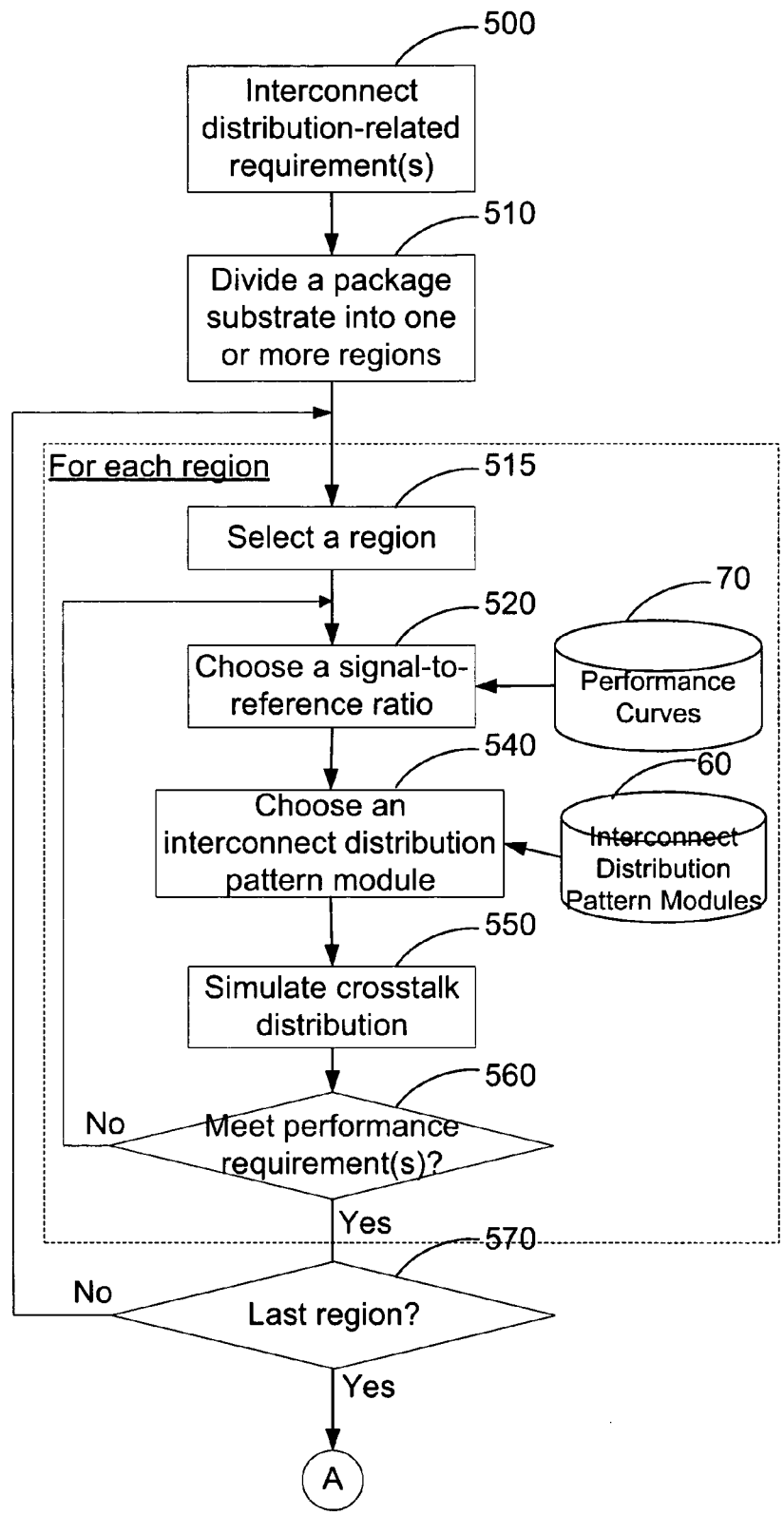
FIG. 5A is a flowchart illustrating how an interconnect distribution designer allocates an array of interconnects on a surface of a package substrate according to some embodiments of the present invention.
Figure 5B:
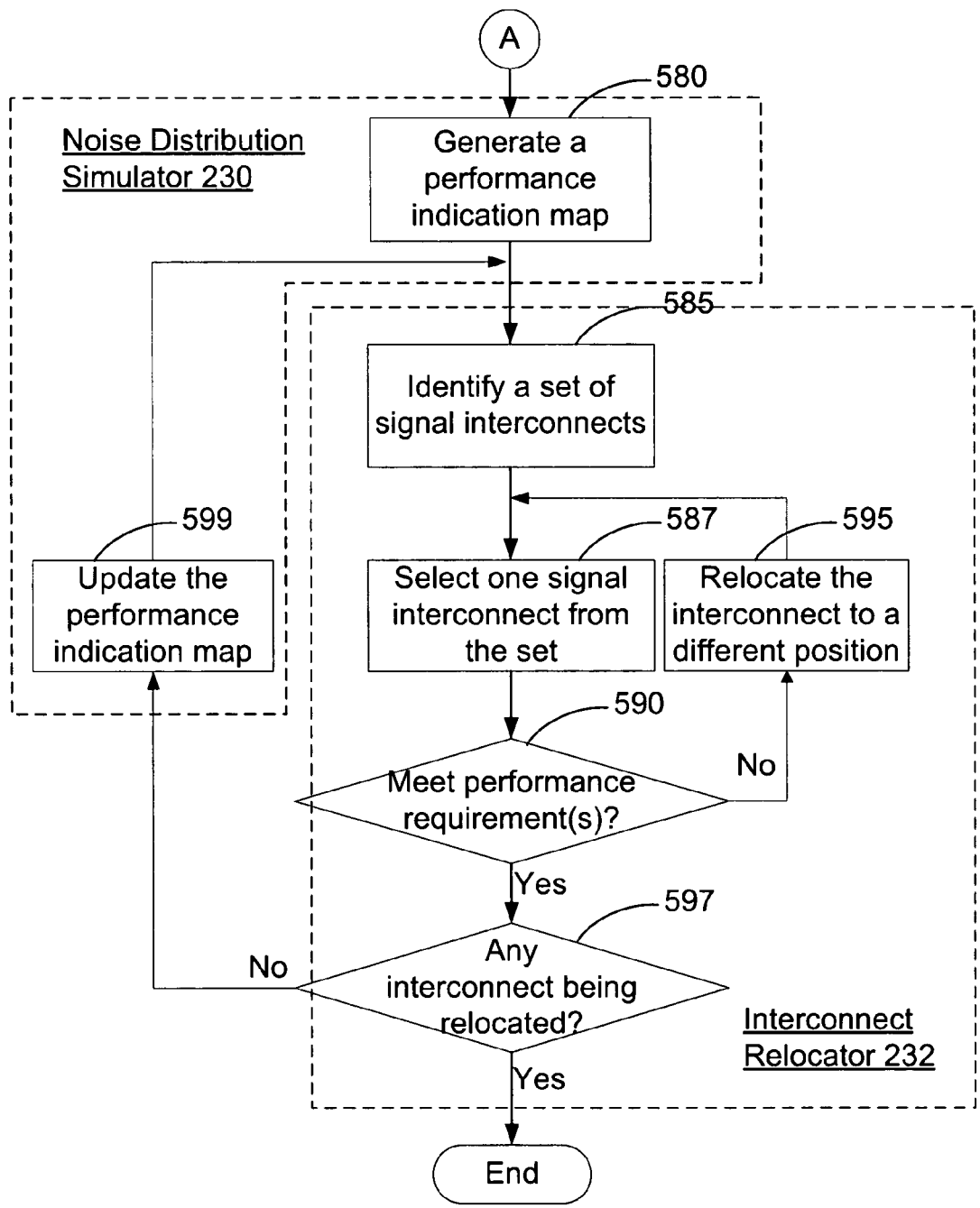
FIG. 5B is a flowchart illustrating how to relocate a subset of the array of interconnects on the substrate surface according to some embodiments of the present invention.

FIG. 5A is a flowchart illustrating how an interconnect distribution designer allocates an array of interconnects on a surface of a package substrate according to some embodiments of the present invention. Upon receipt of various interconnect distribution related requirements (500), the interconnect distribution designer divides the package substrate into one or more regions (510). This division of the package substrate makes it possible to cluster different types of signal interconnects into different regions. For example, a clock signal to the circuit is often sensitive to crosstalk interference from other interconnects and a corrupted clock signal may have a widespread impact on the operation of the circuit. Similarly, a clean power supply to the circuit is critical to maintain the circuit's signal integrity at or above an acceptable level. Therefore, it may be desirable to group interconnects associated with clock signals, power supplies and the like in a particular region and separate them from other aggressor interconnects to satisfy the various requirements. As a consequence of the division, different regions may be associated with different sets of circuit performance requirements.

The designer then allocates interconnects within one region at a time. For each selected region (515), the interconnect distribution designer identifies from the database one or more performance curves that relate some or all of the performance requirements to one or more parameters of the interconnect distribution pattern. From the identified curves, the interconnect distribution designer finds a signal-to-reference ratio matching the performance requirements of the region such as the accumulated mutual inductance and the ground bounce (520). Next, the interconnect distribution designer chooses an interconnect distribution pattern module from the interconnect distribution pattern module database 60 for the chosen signal-to-reference ratio.

The fact that the chosen module may satisfy the performance requirements according to the performance curves does not guarantee that this goal will actually be met. Certain package-level requirements may prevent the chosen module from attaining the goal. Accordingly, the interconnect distribution designer simulates the distribution of crosstalk, e.g., in the form of accumulated mutual inductance and/or ground bounce, within the region using the chosen module or modules (550) and determines if the performance requirements have indeed been met (560). If not, the interconnect distribution designer may have to repeat steps 520, 540, 550 and 560 until the goal is met. After that, the designer checks if this is the last region to be filled (570). If not, it returns to step 515 to fill the next region until all regions are filled. In some embodiments, the crosstalk simulation is conducted for the whole package, not for a particular region. In this event, step 550 may have to be performed after step 570.

Figure 6A:
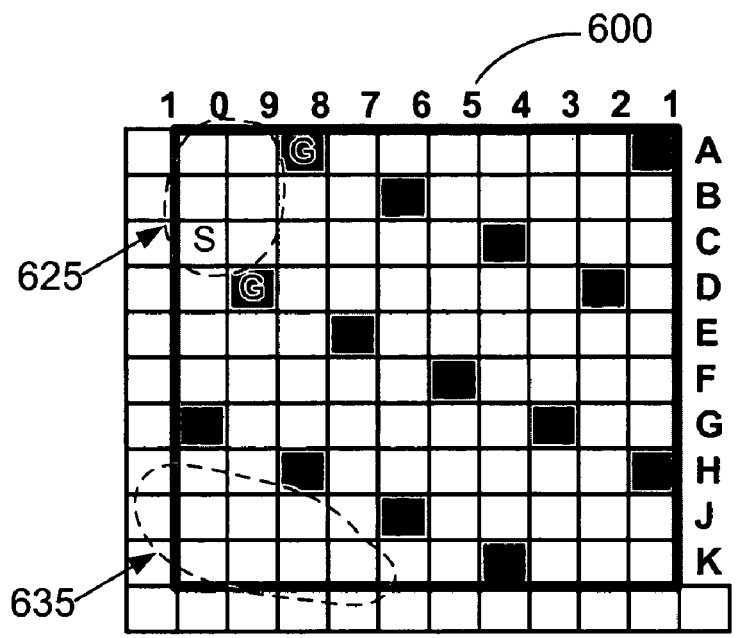
FIGS. 6A and 6B are diagrams depicting two illustrative interconnect distribution schemes and their associated performance indication maps according to some embodiments of the present invention.
Figure 6A:
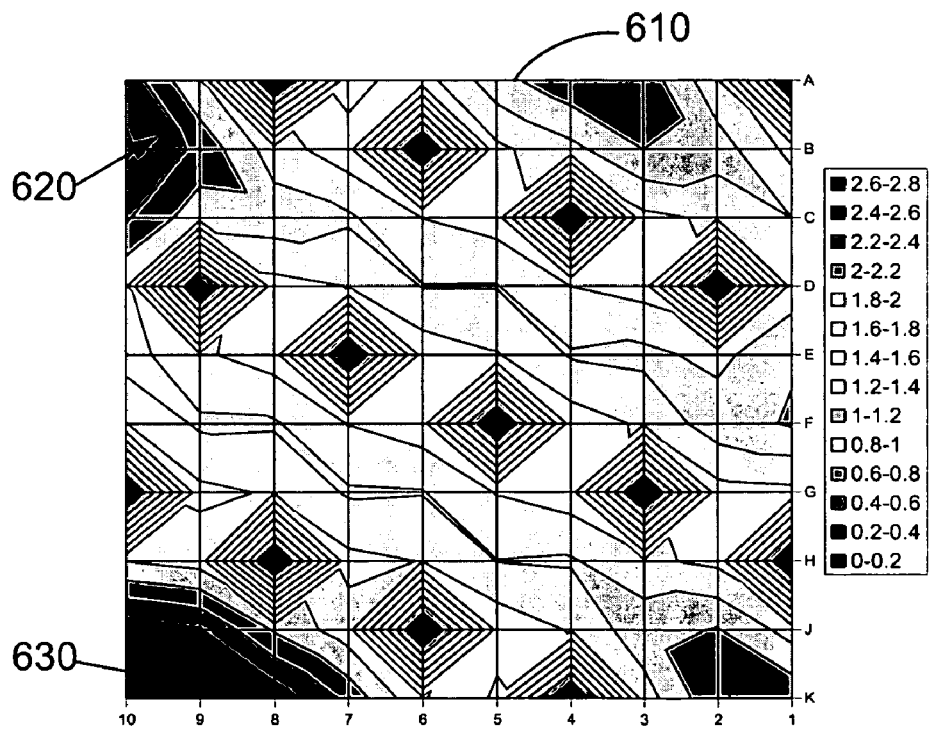
Figure 6B:
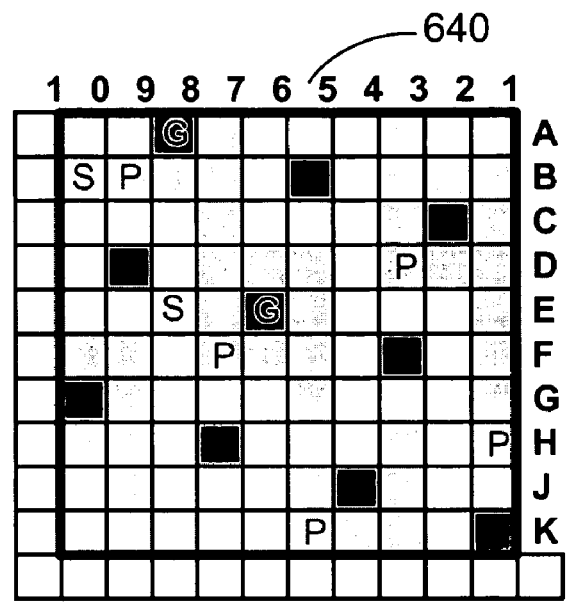
Figure 6B:
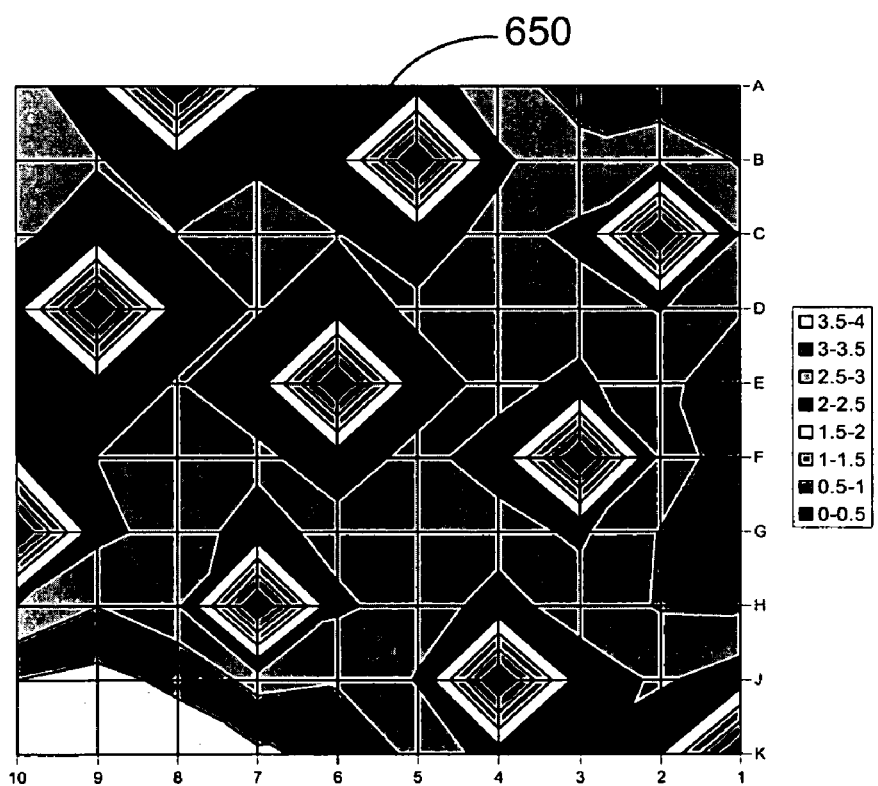

In some embodiments, after all the regions have been filled (570), the interconnect distribution designer may generate a performance indication map for the whole array of interconnects to make sure that the performance requirements of the package have been met by every individual interconnect. FIG. 5B is a flowchart illustrating such a process according to some embodiments of the present invention. The noise distribution simulator 230 and the interconnect relocator 232 shown in FIG. 2 are primarily responsible for performing this process. Specifically, the noise distribution simulator 230 calculates the magnitude of crosstalk at each individual signal interconnect within the array and generates a performance indication map (580). Exemplary performance indication maps are shown in FIGS. 6A and 6B. Based on the generated performance indication map, the interconnect relocator 232 identifies a set of interconnects (585). In some embodiments, this set of interconnects comprises those that are deemed to be particularly critical to the performance of the circuit coupled to the package substrate.

For each identified signal interconnect (587), the interconnect relocator 232 checks the performance indication map to determine whether the simulated crosstalk at this interconnect is within a predetermined limit (590). If true, the signal interconnect is deemed to be free from significant crosstalk interference. If not, the interconnect relocator 232 relocates the signal interconnect to a different position within the same region or even to a neighboring region where there is less crosstalk interference according to the performance indication map (595). After processing all the identified interconnects, the interconnect relocator 232 checks if any of them has been relocated (597). If so, the noise distribution simulator 230 updates the performance indication map using the current locations of the identified signal interconnects (599). The interconnect relocator 232 then repeats the operations from 585 to 597. As shown in FIG. 5B, this iterative process terminates when none of the identified interconnects are subject to significant crosstalk interference.

FIGS. 6A and 6B are diagrams depicting two illustrative interconnect distribution pattern modules 600, 640 and their associated performance indication maps 610, 650 according to some embodiments of the present invention. FIG. 6A depicts interconnect distribution pattern module 600 in which there are too few ground interconnects at the top and lower left corners 625, 635 of the interconnect distribution pattern. As a result, the performance indication map 610 indicates that there are two areas 620 and 630 in the map corresponding to the two corners 625 and 635 in the scheme 600 where the crosstalk exceeds acceptable limits. These areas are also known as "hot spots" since there is no sufficient presence of ground interconnects in each area. In contrast, an area where there is sufficient presence of ground interconnects is referred to as a "quiet spot" or "cold spot". A plausible practice is to keep signal interconnects away from hot spots if possible. For example, it is preferred that critical interconnects be placed in or near a quiet spot and only less critical interconnects be left close to a hot spot. Therefore, if any critical interconnect is near any of those hot spots, it should be relocated to a different spot (preferably a quiet spot) in order for the circuit to have a reliable performance. FIG. 6B depicts interconnect distribution pattern module 640. There is no large area filled with purely signal interconnects in the module 640. This feature is also reflected in the performance indication map 650 where there is no identifiable hot spot in the map.

One skilled in the art will appreciate that the performance indication maps shown in FIGS. 6A and 6B are only for illustrative purposes. Other display formats, e.g., 3-D maps or 3-D histograms, may be used to provide substantially similar results.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. For example, other measures of crosstalk may be used in place of or in addition to the accumulated mutual inductance and/or ground bounce. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method of distributing an array of interconnects on an electronic device, comprising:
    dividing an array of interconnects on a surface of an electronic device into one or more regions, each region having an associated set of performance requirements;
    for each region, using predefined performance data for a plurality of interconnect distribution pattern modules to choose from the plurality of interconnect distribution pattern modules at least one interconnect distribution pattern module that satisfies the set of performance requirements for that region, said predefined performance data relating at least one of the performance requirements to at least one parameter of each interconnect distribution pattern;
    simulating crosstalk distribution within the region using the selected interconnect distribution pattern;
    generating a performance indication map using the chosen interconnect distribution pattern modules;
    checking if an interconnect is located in a region in the performance indication map that does not satisfy the performance requirements of the interconnect; and
    moving the interconnect if it is located in a region in the performance indication map that does not satisfy the performance requirements of the interconnect.

2. The method of claim 1, wherein using predefined performance data to choose at least one interconnect distribution pattern module further includes:
    determining a signal-to-reference ratio for the region where the ratio is a number of signal interconnects to the number of ground and power supply interconnects in the region;
    selecting from the plurality of interconnect distribution pattern modules an interconnect distribution pattern module that satisfies the signal-to-reference ratio;
    simulating crosstalk distribution within the region using the selected interconnect distribution pattern; and
    repeating said determining, selecting and simulating until the selected interconnect distribution pattern module satisfies the predefined performance requirements.

3. The method of claim 1, wherein generating a performance indication map further includes:
    selecting each signal interconnect in the array;
    simulating crosstalk at the selected signal interconnect from other interconnects in the array; and
    repeating said selecting and simulating to generate the performance indication map for the array of interconnects using the simulated crosstalk.

4. The method of claim 1, wherein the performance requirements associated with a specific region include at least one of a signal integrity requirement, an interconnect count requirement, and a package size requirement.

5. The method of claim 1, wherein the predefined performance data includes at least one pair of a signal-to-reference ratio and an estimated crosstalk.

6. The method of claim 1, wherein each interconnect distribution pattern module comprises a predetermined number of interconnects arranged in a predefined pattern, the interconnects including one or more signal interconnects and at least one reference interconnect.

7. The method of claim 6, wherein the interconnect distribution pattern module has an associated signal-to-reference ratio and a maximum signal-to-reference distance.

8. The method of claim 6, wherein the at least one reference interconnect is an interconnect selected from the group consisting of a ground interconnect and a power supply interconnect.

9. A system for designing interconnect distribution on an electronic device, comprising:
   a main memory;
   a processor; and
   at least one program, stored in the main memory and executed by the processor, the at least one program including:
   an interconnect distributor for distributing an array of interconnects on a surface of an electronic device comprising;
   instructions for dividing an array of interconnects on a surface of an electronic device into one or more regions;
   instructions for associating each region with a set of performance requirements; and
   instructions for using predefined performance data for a plurality of interconnect distribution pattern modules to choose from the plurality of interconnect distribution pattern modules at least one interconnect distribution pattern module for each region that satisfies the set of performance requirements for that region, said predefined performance data relating at least one of the performance requirements to at least one parameter of each interconnect distribution pattern;
   a noise distribution simulator for simulating noise at each interconnect caused by a group of other interconnects; and
   an interconnect relocator for relocating an interconnect from one location to another location in a predefined manner that includes moving the interconnect from one location having a high level of simulated noise to another location having a low level of simulated noise, wherein the interconnect relocator includes:
   instructions for checking if an interconnect is located in a location having a high level of simulated noise; and
   instructions for moving the interconnect out of the location having a high level of simulated noise if the level of simulated noise exceeds the performance requirements of the interconnect.

10. The system of claim 9, wherein the noise distribution simulator includes:
   instructions for selecting each signal interconnect in the array;
   instructions for simulating crosstalk at the selected signal interconnect from other interconnects in the array; and
   instructions for repeating said selecting and simulating to generate the performance indication map for the array of interconnects.

11. The system of claim 9, wherein the main memory further includes:
   one or more performance requirements including a signal integrity requirement, an interconnect count requirement, and/or a package size requirement;
   performance data including multiple pairs of signal-to-reference ratios and their associated crosstalk magnitudes; and
   one or more interconnect distribution pattern modules, each module including a predetermined number of interconnects arranged in a predefined module and the interconnects including one or more signal interconnects and at least one reference interconnect.

12. The system of claim 11, wherein the at least one reference interconnect is an interconnect selected from the group consisting of a ground interconnect and a power supply interconnect.

13. A computer program product for use in conjunction with a computer system, the computer program product comprising a computer readable storage medium and a computer program mechanism embedded therein, the computer program mechanism comprising:
   instructions for distributing an array of interconnects on a surface of an electronic device comprising;
   instructions for dividing an array of interconnects on a surface of an electronic device into one or more regions;
   instructions for associating each region with a set of performance requirements; and
   instructions for using predefined performance data for a plurality of interconnect distribution pattern modules to choose from the plurality of interconnect distribution pattern modules at least one interconnect distribution pattern module for each region that satisfies the set of performance requirements for that region, said predefined performance data relating at least one of the performance requirements to at least one parameter of each interconnect distribution pattern;
   instructions for simulating noise at each interconnect caused by a group of other interconnects; and
   instructions for relocating an interconnect from one location to another location in a predefined manner that includes moving the interconnect from one location having a high level of simulated noise to another location having a low level of simulated noise, wherein the instructions for relocating an interconnect include:
   instructions for checking if an interconnect is located in a location having a high level of simulated noise; and
   instructions for moving the interconnect out of the location having a high level of simulated noise if the level of simulated noise exceeds the performance requirements of the interconnect.

14. The computer program product of claim 13, wherein the instructions for simulating noise include:
   instructions for selecting each signal interconnect in the array;
   instructions for simulating crosstalk at the selected signal interconnect from other interconnects in the array; and
   instructions for repeating said selecting and simulating to generate a performance indication map for the array of interconnects using the simulated crosstalk.

* * * * *